US012733453B2

(12) United States Patent
Venkatagiriyappa et al.

(10) Patent No.: US 12,733,453 B2
(45) Date of Patent: Sep. 8, 2026

(54) SUSCEPTOR ASSEMBLY THERMAL BREAK AND METHODS FOR COOLING A SUSCEPTOR ASSEMBLY

(71) Applicant: Applied Materials, Inc., Santa Clara, CA (US)

(72) Inventors: Vijayabhaskara Venkatagiriyappa, Bangalore (IN); Laxman Vitthalrao Deshmukh, Bangalore (IN); Chau T. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 18/380,004

(22) Filed: Oct. 13, 2023

(65) Prior Publication Data

US 2025/0125183 A1 Apr. 17, 2025

(51) Int. Cl.

*C23C 14/50* (2006.01)
*H05B 3/00* (2006.01)
*H10P 72/00* (2026.01)
*H10P 72/76* (2026.01)

(52) U.S. Cl.

CPC ....... *H10P 72/7624* (2026.01); *H05B 3/0047* (2013.01); *H10P 72/0432* (2026.01); *H10P 72/0602* (2026.01)

(58) Field of Classification Search

CPC ............. H10P 72/7624; H10P 72/0432; H10P 72/0602; H10P 72/0434; H10P 72/7626; H10P 72/7618; H10P 72/127; H10P 72/0431; H10P 72/7604; H10P 72/00; H05B 3/0047; C23C 14/50; C23C 16/46; C23C 16/4583; C23C 16/458; C23C 16/463; C23C 16/4586; C23C 16/4581; H01J 37/32715; H01J 37/20

USPC ............... 118/728, 729, 730, 731, 732, 733; 156/345.51, 345.52, 345.53, 345.54, 156/345.55; 269/21; 279/128

See application file for complete search history.

(56) References Cited

U.S. PATENT DOCUMENTS 4,559,718 A * 12/1985 Tadokoro .................. F26B 5/08 414/935
5,177,878 A * 1/1993 Visser ..................... C23C 14/50 34/239
5,421,892 A * 6/1995 Miyagi ................... C23C 16/46 118/724
5,630,881 A * 5/1997 Ogure ................. C23C 16/4584 118/733
6,149,365 A 11/2000 White et al.
6,296,255 B1 * 10/2001 Hashimoto ............ F16J 15/006 277/927
6,344,084 B1 * 2/2002 Koinuma ............. B01J 19/0046 118/729
6,689,221 B2 * 2/2004 Ryding ................. C23C 14/505 118/724

(Continued)

OTHER PUBLICATIONS

US 10,184,180 B2, 01/2019, Yudovsky et al. (withdrawn)

*Primary Examiner* — Rudy Zervigon
(74) *Attorney, Agent, or Firm* — Servilla Whitney LLC

(57) ABSTRACT

Apparatus and methods for cooling down a susceptor assembly are described. A heat exchange passage in a susceptor assembly thermal break transfers heat from processing gases that flow through the susceptor assembly to a cooling jacket and cools down the susceptor assembly and associated hardware.

14 Claims, 6 Drawing Sheets

(56) References Cited

U.S. PATENT DOCUMENTS

| | | | | |
|---|---|---|---|---|
| 7,381,274 | B2 * | 6/2008 | Lee | C23C 16/45544 156/345.33 |
| 8,486,222 | B2 * | 7/2013 | Akao | H10D 64/01342 414/217 |
| 8,955,406 | B2 * | 2/2015 | Yamada | H10P 72/0434 414/217 |
| 9,279,185 | B2 * | 3/2016 | Li | C23C 16/45563 |
| 11,217,433 | B2 * | 1/2022 | Mitchell | H01J 37/32724 |
| 12,112,972 | B2 * | 10/2024 | Liang | C23C 16/4584 |
| 2001/0006043 | A1 | 7/2001 | Shealy et al. | |
| 2002/0139307 | A1 * | 10/2002 | Ryding | C23C 14/505 118/500 |
| 2011/0053382 | A1 * | 3/2011 | Yanagisawa | C23C 16/463 118/724 |
| 2012/0108080 | A1 * | 5/2012 | Akao | H10D 64/01342 219/757 |
| 2013/0058740 | A1 * | 3/2013 | Yamada | H10P 72/0434 414/217 |
| 2013/0113169 | A1 * | 5/2013 | Sugi | H10P 72/0434 279/128 |
| 2014/0290862 | A1 * | 10/2014 | Sugi | H01J 37/32715 118/728 |
| 2017/0076914 | A1 * | 3/2017 | Nozawa | H01J 37/32009 |
| 2019/0103301 | A1 * | 4/2019 | Tashiro | H01J 37/32715 |

* cited by examiner

FIG. 5

SUSCEPTOR ASSEMBLY THERMAL BREAK AND METHODS FOR COOLING A SUSCEPTOR ASSEMBLY

TECHNICAL FIELD

The present disclosure relates generally to apparatus and methods of cooling a susceptor assembly during processing. In particular, embodiments of the disclosure related to thermal breaks for susceptor assemblies that increase temperature control across a susceptor.

BACKGROUND

In chemical vapor deposition (CVD) and atomic layer deposition (ALD) processing, single substrate processing or carousel type processing systems are used. In these systems the substrate, also referred to as wafers, move and/or rotate relative to the precursor injector and/or heater assembly. When the motion creates acceleration forces larger than that of the frictional force, the wafer can become displaced causing damage or related issues. The wafers placed off-axis can slip at high acceleration/deceleration on a moving/rotating susceptor. Friction from the weight of the wafer itself may be insufficient to hold the wafer on tools where higher throughput is sought. One solution to this problem is the use of pressure differential to hold substrates on a susceptor under large acceleration forces. A pressure differential between the front side of the wafer and the back side of the wafer generates a positive pressure force adequate to hold the wafer against relativity large acceleration forces. To achieve such pressure differential, vacuum is applied to the back of the wafers. The positive pressure resultant from the flow of processing gas on the surface of the wafers together with the negative pressure provided by the vacuum on the back of the substrate keeps the wafers in wafer pockets during processing.

As a result of the susceptor being heated to elevated temperatures, having high rotating speeds and receiving hot processing gas, susceptor assemblies, including the motors, are subject to overheating. The elevated temperatures often employed in the deposition process are reached by control of the gas flow temperatures and through temperature control of the susceptor (or substrate support). If the process temperature is too high relative to the motor maximum temperature rating, overheating can occur which may cause damage to the susceptor assembly, motor, and their various parts. In addition, replacement of the damaged components causes process chamber downtime which affects the cost-of-ownership and overall throughput for the chamber.

In current processing chambers, the motor shaft that connects the substrate support with the rotating motor include a water cooling block separated by vacuum seals to help maintain suitable operating temperatures. The temperature transfer from the shaft and cooling body and the heat transfer path is complicated resulting in a heat transfer rate that is insufficient.

Motors with increased maximum operating temperatures may help to alleviate some of the motor overheating issues. However, developing motors with increase maximum operating temperatures are expensive and have long lead times for development and qualification of the components.

Accordingly, there is a need in the art for apparatus and methods to help keep the susceptor assembly temperature to acceptable levels to prevent accidental damage to the hardware and increase production.

SUMMARY

One or more embodiments of the disclosure are directed to a susceptor assembly thermal break comprising a body having a first end and a second end defining a length of the body, the first end having an inlet opening in a first end face, the second end having an outlet opening in a second end face. A channel extends through the length of the body from the inlet opening to the outlet opening. The susceptor assembly thermal break further comprises a heat exchange passage within the body, the heat exchange passage having an inlet passage adjacent to and spaced from a side of the channel. The inlet passage extends from an inlet passage opening in the second end face to an annular passage extending around and spaced from the channel within the body. The annular passage is located within the length of the body. An outlet passage adjacent to and spaced from the side of the channel within the body extends from the annular passage to an outlet passage opening in the second end face. The inlet passage, the annular passage and the outlet passage define a heat exchange flow path within the heat exchange passage.

One or more embodiments of the disclosure are directed to a susceptor assembly thermal break comprising a body having a top portion and a bottom portion, the top portion having a top portion first end and a top portion second end defining a length of the top portion, the top portion first end having a top portion inlet opening in a top portion first end face, the top portion second end having a top portion outlet opening in a top portion second end face, the bottom portion having a bottom portion first end and a bottom portion second end defining a length of the bottom portion, the bottom portion first end having a bottom portion inlet opening in a bottom portion first end face, the bottom portion second end having a bottom portion outlet opening in a bottom portion second end face. A top portion channel extends through the length of the top portion from the top portion inlet opening to the top portion outlet opening. A bottom portion channel extends through the length of the bottom portion from the bottom portion inlet opening to the bottom portion outlet opening. The top portion channel, the bottom portion channel, the top portion inlet opening, the top portion outlet opening, the bottom portion inlet opening, and the bottom portion outlet opening are in fluid communication. The top portion channel and the bottom portion channel form a body channel. The body channel extends through the length of the body of the susceptor assembly thermal break from the top portion inlet opening to the bottom portion outlet opening. The susceptor assembly thermal break further comprises a heat exchange passage within the body. The heat exchange passage comprises an inlet passage adjacent to and spaced from a side of the body channel and extends from an inlet passage opening in the bottom portion second end face to an annular passage extending around and spaced from the body channel. The annular passage is located within the length of the body. An outlet passage adjacent to and spaced from the side of the body channel extends from the annular passage to an outlet passage opening in the bottom portion second end face. The inlet passage, the annular passage and the outlet passage define a heat exchange flow path within the heat exchange passage.

One or more embodiments of the disclosure are directed to a susceptor assembly comprising the susceptor assembly thermal break according to one or more embodiments of the disclosure and a cooling jacket having a first end and a second end defining a length of the cooling jacket, the first end of the cooling jacket having an inlet opening in a first end face, the second end of the cooling jacket having an outlet opening in a second end face, the first end of the cooling jacket is configured to removably receive the second end of the susceptor assembly thermal break in some embodiments and the second end of the bottom potion of the susceptor thermal break assembly in other embodiments. The susceptor assembly further comprises a cooling jacket channel extending through the length of the cooling jacket from the first end of the cooling jacket to the second end of the cooling jacket. The cooling jacket channel is aligned with the channel extending through the body of the susceptor assembly thermal break. The cooling jacket comprises an inlet cooling passage having an inlet cooling passage outlet opening in the first end of the cooling jacket. The inlet cooling passage is in fluid communication with the inlet passage of the heat exchange passage of the susceptor assembly thermal break. The cooling jacket further comprises an outlet cooling passage having an outlet cooling passage inlet opening in the first end of the cooling jacket. The outlet cooling passage is in fluid communication with the outlet passage of the heat exchange passage of the susceptor assembly thermal break.

BRIEF DESCRIPTION OF THE DRAWINGS

So that the manner in which the above recited features of the present disclosure can be understood in detail, a more particular description of the disclosure, briefly summarized above, may be made by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5 shows a partial cross sectional view of a susceptor assembly in accordance with one or more embodiments of the disclosure.

Figure 1:
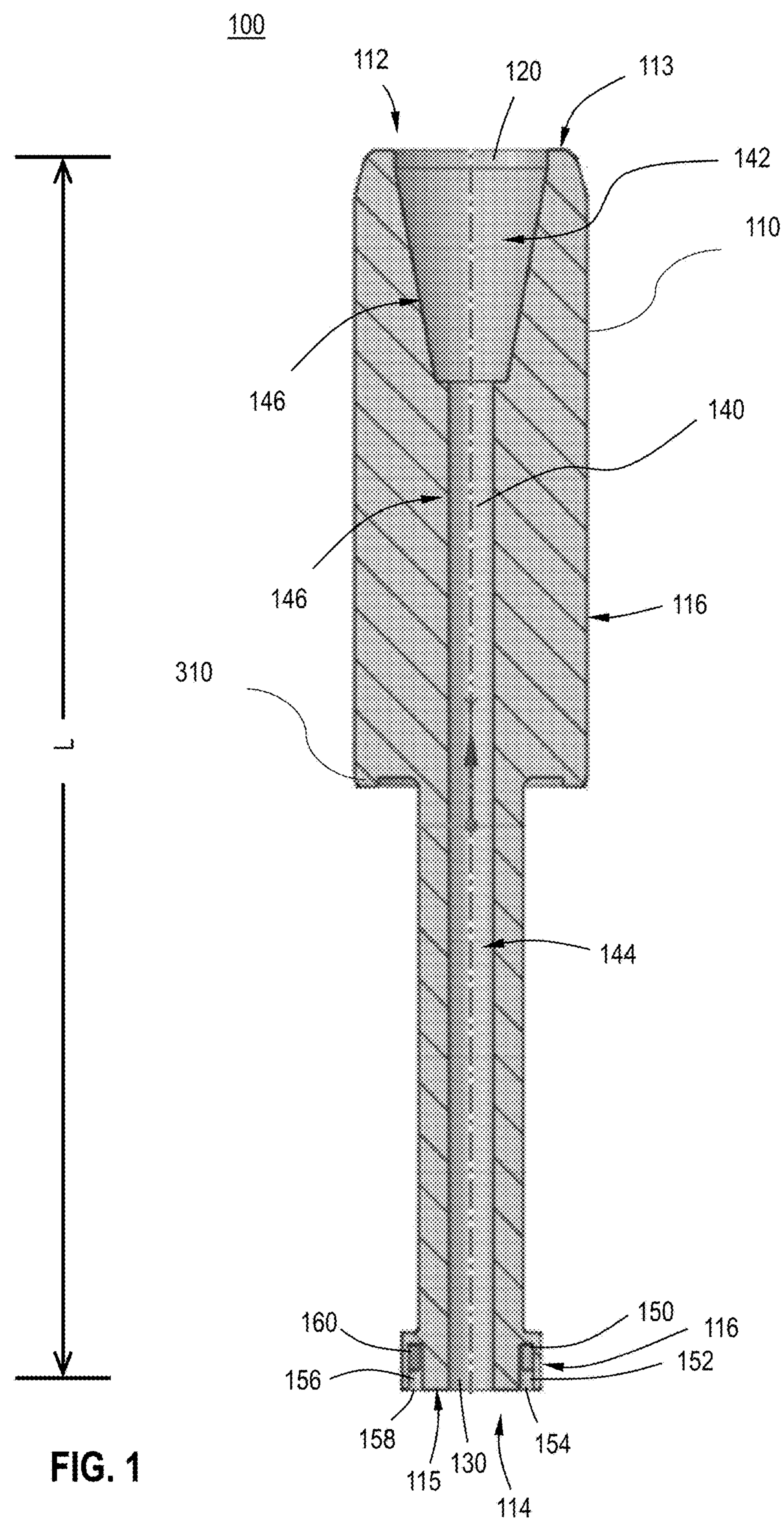
FIG. 1 shows a cross-sectional view of a susceptor assembly thermal break in accordance with one or more embodiments of the disclosure.

To facilitate understanding, identical reference numerals have been used, where possible, to designate identical elements that are common to the figures. It is contemplated that elements and features of one embodiment may be beneficially utilized in other embodiments without further recitation The cross-hatched shading of the components in the figures are intended to aid in visualization of different parts and do not necessarily indicate different materials of construction.

DETAILED DESCRIPTION

Before describing several exemplary embodiments of the disclosure, it is to be understood that the disclosure is not limited to the details of construction or process steps set forth in the following description. The claimed apparatus and methods are capable of other embodiments and of being practiced or being carried out in various ways.

Embodiments of the disclosure provide methods and apparatus capable of cooling down a susceptor assembly during processing to prevent or minimize maintenance time due to damage to hardware assembly, for example, susceptor assembly, bearings, and motor. The susceptor assembly can connect to a vacuum source through the rotation shaft of a motor below the susceptor assembly. The flow of hot processing gas and rotation of the motor subjects the susceptor assembly to high temperatures. Specific embodiments of the disclosure are directed to apparatus and methods for transferring heat from a susceptor assembly facilitated by a unique susceptor assembly thermal break and cooling jacket design.

In some embodiments, the apparatus and methods use a cooling jacket to decrease temperature across the profile of a susceptor assembly. In some embodiments, the disclosure relates to apparatus and methods using a susceptor assembly thermal break to cool down a shaft of a susceptor assembly. In particular embodiments, the disclosure relates to apparatus and methods using a heat exchange passage in a susceptor assembly thermal break to decrease the temperature across desired locations in the susceptor assembly thermal break. In more particular embodiments, the disclosure relates to apparatus and method using a heat sink in a susceptor assembly thermal break to cool down a bearing of a motor, the motor and associated hardware. Some embodiments of the disclosure advantageously provide thermal breaks for existing susceptor assemblies allowing current chambers to be retrofit.

In some special embodiments, a heat sink within a body of the susceptor assembly thermal break absorbs heat from motor hardware, for example bearings and transfers the heat to a heat exchange passage within the body of the susceptor assembly thermal break.

FIG. 1 shows a susceptor assembly thermal break 100 in accordance with one or more embodiments of the disclosure. The susceptor assembly thermal break 100 includes a body 110 having a first end 112 and a second end 114. The first end 112 and the second end 114 defines a length L of the body 110. In the embodiment illustrated in the Figures, the body 110 has a generally cylindrical shape with varying cross-sectional diameters and steps along the length L of the body 110. However, those skilled in the art will understand that this is merely representative of one possible configuration and the body 110 can have any suitable shape. For example, in some embodiments, the body 110 can taper from the first end 112 to the second end 114 or can have cross-sectional portions that are not round.

An inlet opening 120 is located in the first end 112 of the body 110 in a first end face 113 thereof. The second end 114 has an outlet opening 130 in a second end face 115 thereof.

A channel 140 extends from the inlet opening 120 in the first end face 113 to the outlet opening 130 in the second end face 115. The inlet opening 120, the outlet opening 130, and the channel 140 are in fluid communication so that a flow of processing gas can flow through the length L of the body 110 from the inlet opening 120 to the outlet opening 130 through channel 140. In some embodiments, the channel 140 is coaxial with respect to the body 110.

The channel 140 can have any suitable shape along the length L of the body 110. In some embodiments, the channel 140 has a fixed cross-sectional diameter along the length L of the body 110. In some embodiments, as shown in the Figures, the channel 140 comprises multiple portions with different sized and/or shaped channel 140 dimensions. For example, in FIG. 1, the channel 140 has two distinct portions: a first portion 142 and a second portion 144. The first portion 142 has a flared profile, or funnel-like profile, that extends from the inlet opening 120 to the second portion 144 of the channel 140, and the second portion 144 of the channel 140 has a uniform diameter from the end of the first portion 142 to the second end 114 of the body 110.

In some embodiments, as shown in the Figures, the inlet opening 120 has a larger diameter than the channel 140. Although, FIG. 1 shows that the channel 140 comprises a flared first portion 182, the embodiments of the present disclosure are not limited to the particular shape illustrated, for example the channel can be substantially cylindrical or have any other shape. It is understood that different profiles of the channel 140 can be implemented for different needs in terms of at least, heat transfer from the channel 140.

The susceptor assembly thermal break 100 further comprises a heat exchange passage 150. The heat exchange passage 150 includes an inlet passage 152. The inlet passage 152 is adjacent to and spaced from a sidewall 146 of the channel 180 and from a sidewall 116 of the body 110. The skilled artisan will understand that the term "adjacent" does not necessarily mean close proximity and the distance can be adjusted based on different applications and required heat transfer rate.

The heat exchange passage 150 includes an outlet passage 156. The outlet passage 156 is adjacent to and spaced from the sidewall 146 of the channel 140. The inlet passage 152 extends from an inlet passage opening 154 in the second end face 115 to an annular passage 160 extending around and spaced from the channel 140. The outlet passage 156 extends from the annular passage 160 to an outlet passage opening 158 in the second end face 115. The inlet passage 152, the annular passage 160 and the outlet passage 156 define a heat exchange flow path of the heat exchange passage 190.

In some embodiments, as illustrated in FIG. 1, the susceptor assembly thermal break 100 is a single piece body 110. In such an embodiment, the annular passage 230 is located within the length of the body L at a distance from the second end face 115. In some embodiments, the annular passages 230 is located at a distance less than and including 25%, 20%, 15% or 10% of the length L of the body 110 from the second end face 115. In some embodiments, the annular passage 230 is located within the range of 25% to 75%, or 30% to 70%, or 35% to 65% of the length L of the body 110 from the second end face 115. In some embodiments, the annular passage 230 is located at a distance less than and including 25%, 20%, 15% or 10% of the length L of the body 110 from the first end face 113.

In use, a fluid flows from the inlet passage opening 154 through the inlet passage 152 to the annular passage 160 and absorbs heat from the sidewall 146 of channel 140 and/or the body 110.

Figure 2:
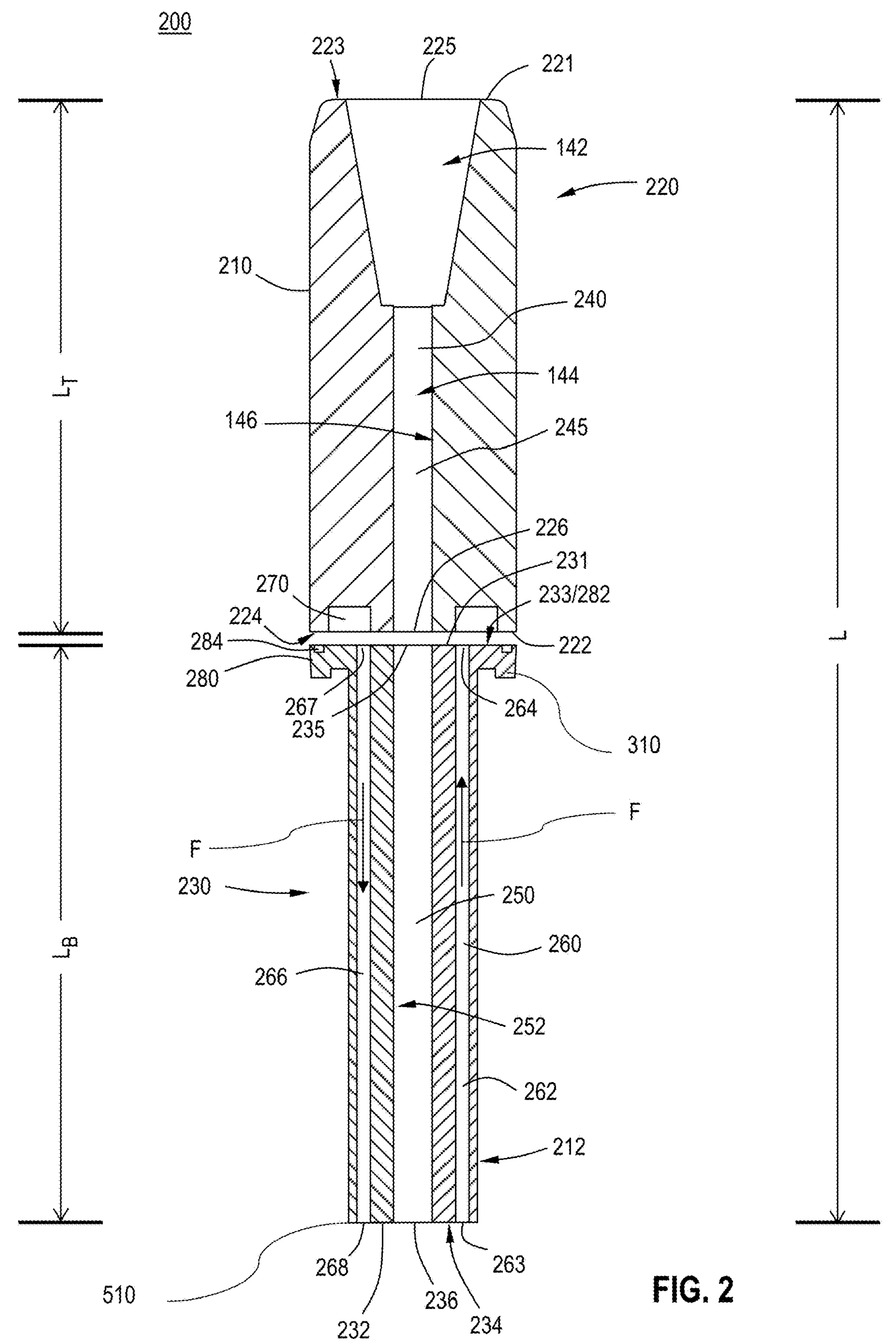
FIG. 2 shows a cross-sectional view of a susceptor assembly thermal break in accordance with one or more embodiments of the disclosure.

Referring to FIG. 2, in some embodiments, the susceptor assembly thermal break 200 comprises two pieces connected together. FIG. 2 shows the two pieces separated for descriptive purposes.

The susceptor assembly thermal break 200 illustrated in FIG. 2 has a top portion 220 and a bottom portion 230 that can be connected together to form the body 210. The two pieces can be connected together by any suitable connection known to the skilled artisan. For example, the pieces can be screwed together with a suitable O-ring, or welded together. Stated differently, the body 210 of some embodiments comprises a top portion 220 and a bottom portion 230.

The skilled artisan will understand that the terms "top" and "bottom" do not necessarily indicate any particular direction or location based on the direction of gravity and are defined as the relative position of the features to each other.

The top portion 220 has a top portion first end 221 and a top portion second end 222 defining a length of the top portion (LT). The top portion first end 221 has a top portion inlet opening 225 in a top portion first end face 223. The top portion second end 222 has a top portion outlet opening 226 in a top portion second end face 224.

The bottom portion 230 has a bottom portion first end 231 and a bottom portion second end 232 defining a length of the bottom portion (LB). The bottom portion first end 231 has a bottom portion inlet opening 235 in a bottom portion first end face 233. The bottom portion second end 232 has a bottom portion outlet opening 236 in a bottom portion second end face 234.

The top portion 220 has a channel 240 that extends from the top portion inlet opening 225 to the top portion outlet opening 226 through the length LT of the top portion 220. The top portion inlet opening 225, the top portion channel 240, and the top portion outlet opening 226 are in fluid communication to allow a flow of a fluid to pass through the length LT of the top portion 220.

The bottom portion 230 has a bottom portion channel 250 that extends from the bottom portion inlet opening 235 to the bottom portion outlet opening 236 through the length LB of the bottom portion 230. The bottom portion inlet opening 235, the channel 250 of the bottom portion 230, and the bottom portion outlet opening 236 are in fluid communication to allow a flow of a fluid to pass through the length LB of the bottom portion 230.

The top portion channel 240, the bottom portion channel 250, the top portion inlet opening 225, the top portion outlet opening 226, the bottom portion inlet opening 235, and the bottom portion outlet opening 236 are in fluid communication. When the top portion 220 and the bottom portion 230 are connected, the top portion channel 240 and the bottom portion channel 250 are aligned and form a body channel 245 that extends through the length L of the body 210. from the top portion inlet opening 225 to the bottom portion outlet opening 236. In the illustrated embodiment, similar to that shown in FIG. 1, the top portion channel 240 is equivalent to at least a portion of the channel 140 with a first portion 142 and a second portion 144 and sidewalls 146.

The susceptor assembly thermal break 200 further comprises a heat exchange passage 260. The heat exchange passage 260 can be formed in one or both of the top portion 220 or bottom portion 230. In the illustrated embodiment, a portion of the heat exchange passage 260 is formed in each of the top portion 220 and bottom portion 230 so that when the top portion 220 and bottom portion 230 are connected, the heat exchange passage 260 is complete.

The heat exchange passage 260 includes an inlet passage 262 in the bottom portion 230 of the body 210. The inlet passage 262 is adjacent to and spaced from the sidewall 252 of the channel 250 and spaced from the sidewall 212 of the body 210. Stated differently, the inlet passage 262 is in the wall of the body 210. In the illustrated embodiment, the inlet passage 262 extends the length LB of the bottom portion 230 with an inlet passage bottom opening 263 in the second end face 234 and an inlet passage top opening 264 in the first end face 233.

The heat exchange passage 260 includes an outlet passage 266 in the bottom portion 230 of the body 210. The outlet passage 266 is adjacent to and spaced from the sidewall 252 of the channel 250 and spaced from the sidewall 212 of the body 210. Stated differently, the outlet passage 266 is within the wall of the body 210. In the illustrated embodiment, the outlet passage 266 extends the length LB of the bottom portion 230 with an outlet passage top opening 267 in the first end face 233 and an outlet passage bottom opening 268 in the second end face 234.

An annular passage 270 is formed in the second end face 224 of the second end 222 of the top portion 220. The annular passage 270 is equivalent in function to the annular passage 160 in the embodiment of FIG. 1. The annular passage 270 is recessed into the second end face 224 and extends around and is spaced from the channel 240.

The length LB and length LT determine the position of the annular passage 270 relative to the second end 232 of the bottom portion 230. In some embodiments, as shown in FIG. 2, the annular passage 270 is in the top portion 220. In some embodiments, the annular passage 270 is in the bottom portion 230.

When the top portion 220 and bottom portion 230 are connected, the inlet passage 262, annular passage 270 and outlet passage 266 are in fluid communication to form the heat exchange passage 260 and define a heat exchange flow path F. In use, a fluid flows through the inlet passage bottom opening 263 into the inlet passage 262, out the inlet passage top opening 264 into the annular passage 270, through outlet passage top opening 267, the outlet passage 266 and out the outlet passage bottom opening 268. In some embodiments, the annular passage 270 is in the top portion 220 with an inlet passage top portion and an outlet passage top portion to resemble the heat exchange passage 150 in FIG. 1. The fluid flowing through the heat exchange flow path F absorbs heat from the sidewall of the body channel 245 and/or the body 210. In some embodiments, the annular passage 230 is coaxially arranged with the body channel 245.

Figure 3:
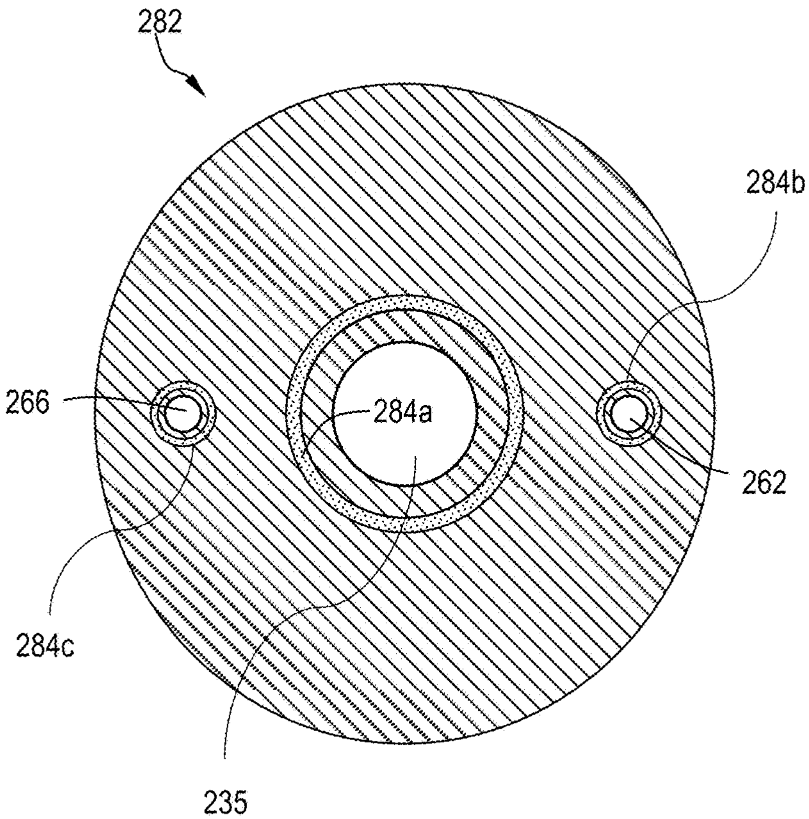
FIG. 3 shows a cross-sectional top view of a bottom portion first flange of a susceptor assembly thermal break in accordance with one or more embodiments of the disclosure.
Figure 4:
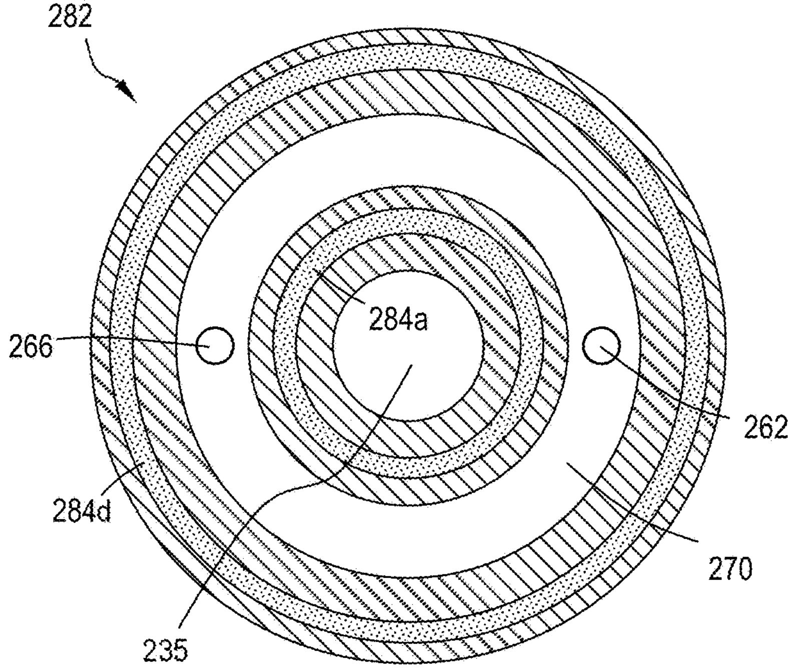
FIG. 4 shows a cross-sectional view of a susceptor assembly in accordance with one or more embodiments of the disclosure.

In some embodiments, as shown in FIGS. 2-4, the bottom portion first end face 233 has a bottom portion first flange 280. The bottom portion first flange 280 has a first flange top face 282 which is the same as the first end face 233 of the bottom portion 230. The first flange top face 282 (first end face 233) has at least one groove 284. The at least one groove 284 is configured to receive an O-ring (not shown) to help maintain a fluid-tight seal between the top portion 220 and the bottom portion 230 when the top portion 220 and the bottom portion 230 are connected. The bottom portion 230 of the susceptor assembly thermal break 200 removably receives the top portion second end face 224 of the susceptor assembly thermal break 200, on the first flange top face 282. For example, the at least one groove 284 is arranged coaxially with the bottom portion channel 250 so that when the top portion 220 connects to the bottom portion 230, the top portion channel 245, the bottom portion channel 250, the top portion outlet opening 226 and the bottom portion inlet opening 235 align and form a fluid connection.

FIG. 3 shows a view of the first flange top face 282 according to one or more embodiment of the disclosure. A groove 284 is formed in the first flange top face 282 around the bottom portion inlet opening 235. The groove 284 around the bottom portion inlet opening 235 is configured to contain an O-ring (not shown) that helps form a fluid-tight seal to prevent gases from passing to or from the bottom portion inlet opening 235 into the environment. In some embodiments, the groove 284*a* is coaxial with the bottom portion inlet opening 235.

In some embodiments, there is a groove 284*b* around the inlet passage 262 and a groove 284*c* around the outlet passage 266. In some embodiments, the groove 284*b* is coaxial with inlet passage 262. In some embodiments, the groove 284*c* is coaxial with inlet passage 262. The groove 284*b* and groove 284*c* are configured to hold an O-ring to seal fluid communication of the inlet passage 262 and outlet passage 266, respectively.

Referring to FIGS. 2 and 3, in some embodiments, when the top portion 220 connects to the bottom portion 230, an O-ring in the groove 284*a* seals the connection between the annular passage 270 in the top portion 220 and the inlet passage 262. In some embodiments, an O-ring in the groove 284*a* seals the connection between the annular passage 270 in the top portion 220 and the outlet passage 266 of the bottom portion 230.

FIG. 4 shows another embodiment of a first flange top face 282 in which the annular passage 270 is formed in the first flange top face 282 of the bottom portion 230. In the illustrated embodiment, the second end face 224 of the top portion 220 is either substantially flat, or has an additional annular passage 270 formed therein which aligns with the annular passage 270 in the first flange top face 282. In the illustrated embodiment, the inlet passage 262 and outlet passage 266 are in fluid communication with the annular passage 270. A groove 284*a* is formed in the first flange top face 282 and surrounds the bottom portion inlet opening 235. In some embodiments, the groove 284*a* is coaxial with the bottom portion inlet opening 235. A groove 284*d* surrounds the annular passage 270 in the first flange top face 282. In some embodiments, the 284*d* is coaxial with the bottom portion inlet opening 235 or the annular passage 270.

Figure 5:
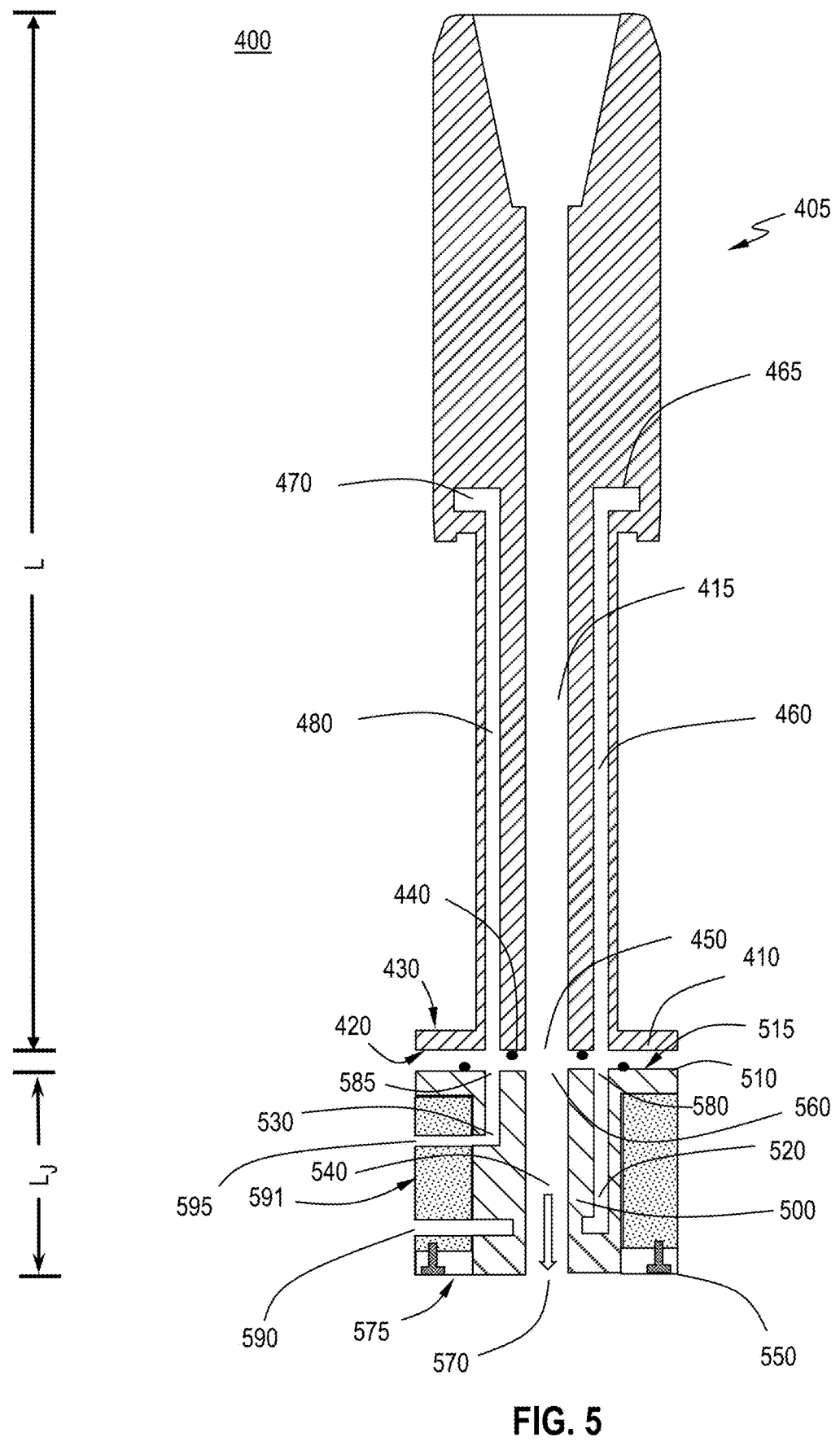

FIG. 5 shows a portion of a susceptor assembly 400 according to some embodiments of the disclosure. The susceptor assembly 400 comprises a susceptor assembly thermal break 405 and a cooling jacket 500. In some embodiments, the susceptor assembly thermal break 405 has a second end flange 410. The second end flange 410 is configured to removably connect the susceptor assembly thermal break 405 to the cooling jacket 500 on a first end 510 of the cooling jacket 500. The first end face 515 of the first end 510 of the cooling jacket 500 removably receives the bottom face 420 of the second end flange 410. The methods of connecting the susceptor assembly thermal break 405 to the cooling jacket are known to the skilled artisan. For example, the second end flange 410 can be clamped or screwed, on a top face 430 of the second end flange 410 to the cooling jacket 500.

In some embodiments, the bottom face 420 of the second end flange 410 has a bottom face vacuum O-ring 440 coaxially arranged with an outlet opening 450 of the susceptor assembly thermal break 405. The bottom face vacuum O-ring 440 prevents process gases from escaping the susceptor assembly 400. In some embodiments, the bottom face 420 further comprises a groove (not shown) recessed in the bottom face 420 in which the O-ring 440 is positioned.

The cooling jacket 500 is in fluid communication with the susceptor assembly thermal break 405. In use, a fluid flows inside an inlet cooling passage 520 within the cooling jacket 500 to an inlet passage 460 of a heat exchange passage 465 within the susceptor assembly thermal break 405, and then to the annular passage 470. The fluid then flows through the outlet passage 480 of the heat exchange passage 465 to an outlet cooling passage 530 within the cooling jacket 500.

A cooling jacket channel 540 extends through a length $L_J$ of the cooling jacket 500. The cooling jacket channel 540 is in fluid communication with the channel 415 of the susceptor assembly thermal break 405. The cooling jacket channel 540 directs the processing gas out of the susceptor assembly 400. A source of vacuum (not shown) connected to the susceptor assembly 400 provides a pressure differential within the length of the body L of the susceptor assembly thermal break 405 and the cooling jacket $L_J$.

The first end 510 of the cooling jacket 500 and a second end 550 of the cooling jacket 500 define the length $L_J$ of the cooling jacket 500. The first end of the cooling jacket 510 has an inlet opening 560 in a first end face 565 of the cooling jacket 500, and the second end of the cooling jacket 550 has an outlet opening 570 in a second end face 575 of the cooling jacket 500. When the susceptor assembly thermal break 405 is connected to the cooling jacket 500, the cooling jacket channel 540 is aligned with the channel 415 of the susceptor assembly thermal break 400.

The inlet cooling passage 520 has an inlet cooling passage outlet opening 580 in the first end face 515 of the cooling jacket 500. When the susceptor assembly thermal break 405 is connected to the cooling jacket 500, the inlet cooling passage outlet opening 580 aligns with the inlet passage 460 of the heat exchange passage 465 of the susceptor assembly thermal break 405.

The outlet cooling passage 530 has an outlet cooling passage inlet opening 585 in the first end face 515 of the cooling jacket 500. When the susceptor assembly thermal break 405 is connected to the cooling jacket 500, the outlet cooling passage inlet opening 585 aligns with the outlet passage 480 of the heat exchange passage 465 of the susceptor assembly thermal break 405.

The inlet cooling passage 520 has an inlet cooling passage inlet opening 590 positioned in a sidewall 591 of the cooling jacket 500. The outlet cooling passage 530 has an outlet cooling passage outlet opening 595 positioned in the sidewall 591 of the cooling jacket 500. In use, the fluid flows through the inlet cooling passage inlet opening 590 to the inlet cooling passage 520. The fluid then exits the inlet cooling passage outlet opening 580 to the heat exchange passage 465. Upon returning from the heat exchange passage 465, the fluid flows into the outlet cooling passage inlet opening 585 and through the outlet cooling passage 530, exits the outlet cooling passage outlet opening 595.

Figure 6:
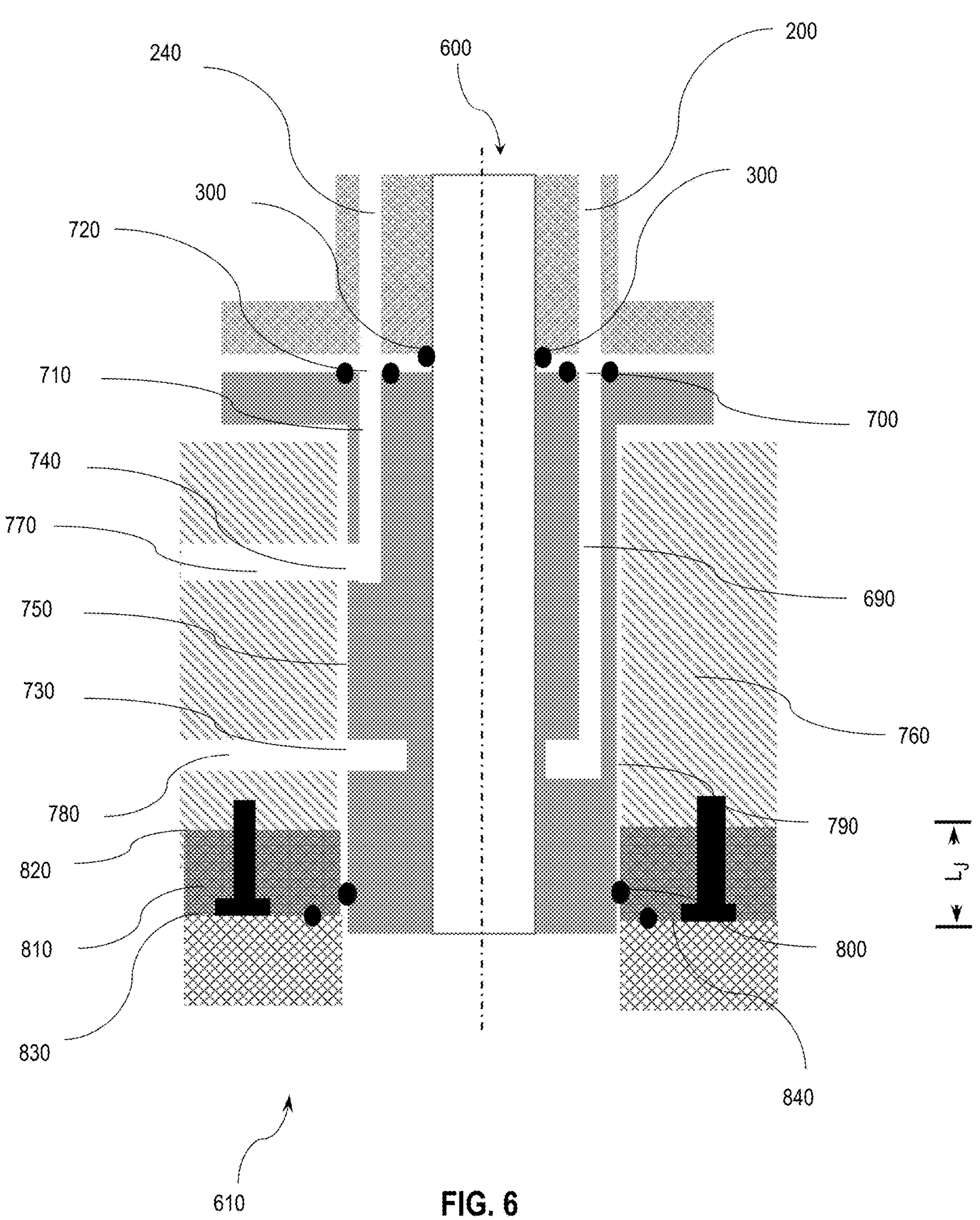
FIG. 6 shows a partial isometric view of a susceptor assembly thermal break in configuration with a susceptor, in accordance with one or more embodiments of the disclosure.

Referring to FIG. 6, in some embodiments, the cooling jacket 500 further comprises an outer cooling jacket 600. The outer cooling jacket 600 is in fluid communication with the cooling jacket 500. The fluid flows from an outer cooling jacket inlet passage 610 into the inlet cooling passage 690 of the cooling jacket 610 and then flows out of the outlet cooling passage 710 of the cooling jacket 610 into an outer cooling jacket outlet passage 780. In some embodiments, the outer cooling jacket partially or fully circumferences the cooling jacket 610 along the length of the cooling jacket $L_J$.

Referring to FIG. 5, in some embodiments the cooling jacket 610 is rotatable inside the outer cooling jacket 760. The cooling jacket 610 is rotated inside the outer cooling jacket 760 by the motor 315. In some embodiments, there is a gap 790 between the cooling jacket 610 and the outer cooling jacket 760. In some embodiments there is a rotary vacuum seal 800 in the gap 790. Th rotary vacuum seal 800 prevents the processing gas to flow back in the gap 790. The gap is coaxially arranged with the cooling jacket 610. The rotary vacuum seal 800 can be positioned in a desired position along the length of the cooling jacket (L4).

In some embodiments, the susceptor assembly 600 further comprises a bottom member 810. The bottom member 810 has a first end 820 and a second end 830 defining a length (L5) of the bottom member 810. The bottom member 810 is configured to removably receive the outer cooling jacket 760 on the bottom member first end 820. The methods of connecting the outer cooling jacket to the bottom member are known in the art. For example, the outer colling jacket can be clamped or screwed to the bottom member.

Figure 7:
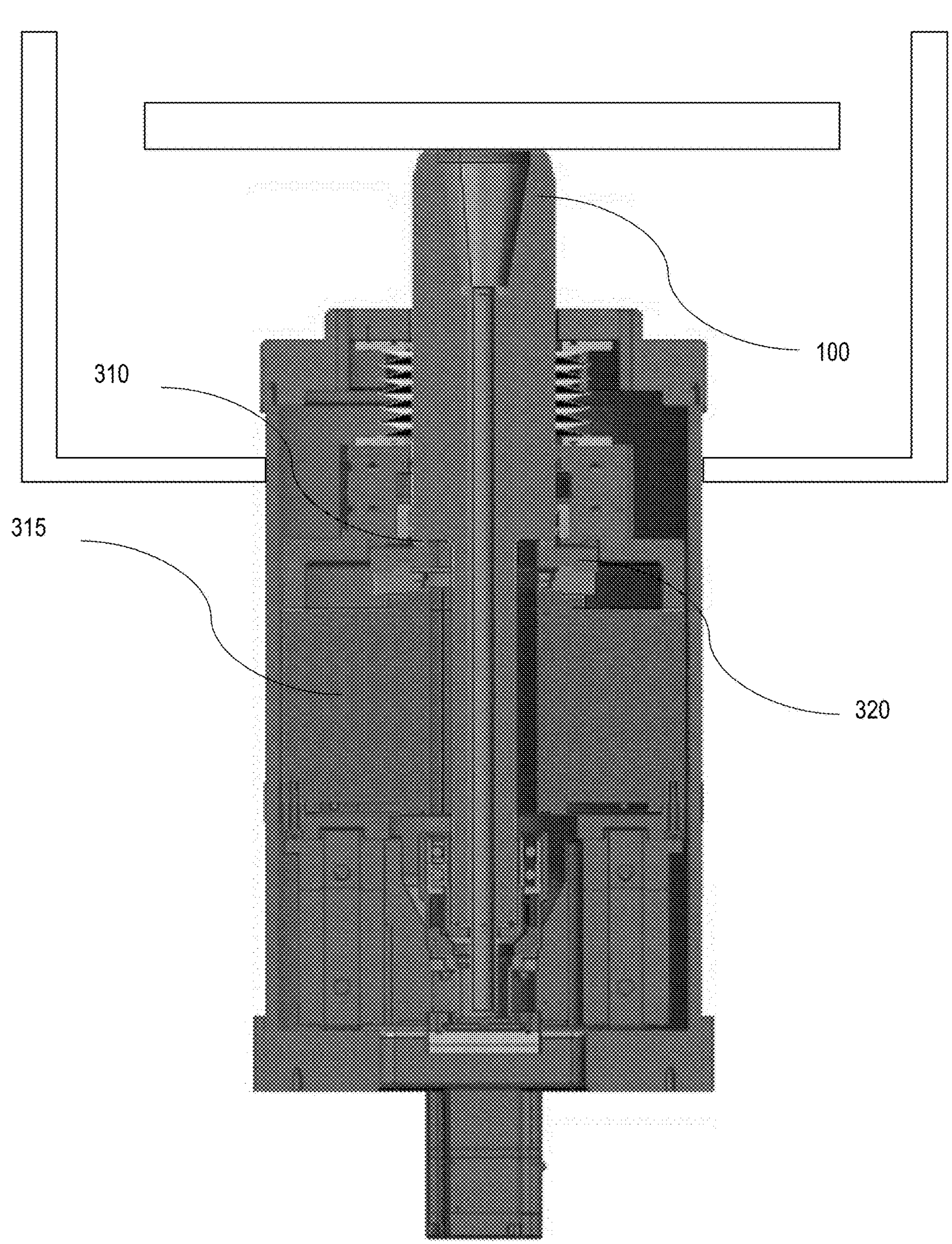
FIG. 7 shows a cross sectional view of a susceptor assembly in configuration with a motor in accordance with one or more embodiments of the disclosure.

Referring to FIG. 2A and FIG. 7, in some specific embodiments, the susceptor assembly thermal break 400 includes a heat sink 310. The heat sink 310 connects to the bearing 320 of the motor 315. Due to passage of hot processing gas and rotation, the temperature of the bearing 320 increases. This increase of temperature can damage the bearing 320. A flow of heat from heat sink 310 to heat exchange passage 190 cools down the bearing 320. This feature of the present disclosure advantageously helps protecting the hardware associated with rotating motor against thermal damage and decreases maintenance time.

In more specific embodiments, the annular passage 230 is located adjacent to the heat sink 310 facilitating heat transfer from the heat sink 310 to the heat exchange passage 190 and out of the susceptor assembly thermal break 400.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A susceptor assembly comprising: the a susceptor assembly thermal break including a body, a channel through the body and a heat exchange passage; a cooling jacket having a first end and a second end defining a length of the cooling jacket, the first end of the cooling jacket having a vacuum inlet opening in a first end face, the second end of the cooling jacket having a vacuum outlet opening in a second end face, the first end of the cooling jacket is configured to removably receive the second end of the susceptor assembly thermal break; a cooling jacket channel extending through the length of the cooling jacket from the first end of the cooling jacket to the second end of the cooling jacket, the cooling jacket channel aligned with the channel extending through the body of the susceptor assembly thermal break; an inlet cooling passage having an inlet cooling passage outlet opening in the first end of the cooling jacket, the inlet cooling passage in fluid communication with the inlet passage of the heat exchange passage of the susceptor assembly thermal break; and an outlet cooling passage having an outlet cooling passage inlet opening in the first end of the cooling jacket, the outlet cooling passage in fluid communication with the outlet passage of the heat exchange passage of the susceptor assembly thermal break.

2. The susceptor assembly of claim 1, wherein the inlet cooling passage has an inlet cooling passage inlet opening positioned in a side wall of the cooling jacket, the outlet cooling passage has an outlet cooling passage outlet opening positioned in a sidewall of the cooling jacket.

3. The susceptor assembly of claim 1, wherein the cooling jacket has an outer cooling jacket, the outer cooling jacket extending through the length of the cooling jacket.

4. The susceptor assembly of claim 3, wherein the cooling jacket is rotatable inside the outer cooling jacket.

5. The susceptor assembly of claim 3, wherein the outer cooling jacket has an outer cooling jacket inlet passage in fluid communication with the inlet cooling passage of the cooling jacket, the outer cooling jacket has an outer cooling jacket outlet passage in fluid communication with the outlet cooling passage of the cooling jacket.

6. The susceptor assembly of claim 3, wherein a gap between the cooling jacket and the outer cooling jacket has a rotary vacuum seal coaxially arranged with the cooling jacket.

7. The susceptor assembly of claim 3, further comprising a bottom member, the bottom member having a bottom member first end and a bottom member second end defining a length of the bottom member, the bottom member configured to removably receive the outer cooling jacket on the bottom member first end.

8. The susceptor assembly of claim 7, wherein the bottom member has a vacuum O-ring on a second end face of the bottom member, the vacuum O-ring coaxially arranged with the cooling jacket channel.

9. The susceptor assembly of claim 1, wherein the body has a first end and a second end defining a length of the body, the first end having vacuum inlet opening in a first end face, the second end having vacuum outlet opening in a second end face, the channel extends through the length of the body, and the heat exchange passage is within the body, the heat exchange passage having an inlet passage adjacent to and spaced from a side of the channel and extending from an inlet passage opening in the second end face to a annular passage extending around and spaced from the channel within the body, the annular passage located within the length of the body, and an outlet passage adjacent to and spaced from the side of the channel within the body and extending from the annular passage to an outlet passage opening in the second end face, the inlet passage, the annular passage and the outlet passage defining a heat exchange flow path.

10. The susceptor assembly of claim 9, wherein the annular passage is coaxially arranged with the channel.

11. The susceptor assembly of claim 9, wherein the channel comprises a flared portion tapering from the vacuum inlet opening to the channel, the vacuum inlet opening has a larger diameter than the channel.

12. The susceptor assembly of claim 9, wherein the second end includes a flange which has a bottom face and a top face.

13. The susceptor assembly of claim 12, wherein the bottom face has a bottom face vacuum O-ring, the bottom face vacuum O-ring coaxially arranged with the vacuum outlet opening.

14. The susceptor assembly of claim 13, further comprising a heat sink positioned in the body, the heat sink configured to absorb heat from a bearing of a motor.

* * * * *